United States Patent [19]
Jochem

[11] Patent Number: 4,764,691
[45] Date of Patent: Aug. 16, 1988

[54] CMOS PROGRAMMABLE LOGIC ARRAY USING NOR GATES FOR CLOCKING

[75] Inventor: Daniel R. Jochem, Pocatello, Idaho

[73] Assignee: American Microsystems, Inc., Santa Clara, Calif.

[21] Appl. No.: 787,234

[22] Filed: Oct. 15, 1985

[51] Int. Cl.$^4$ .................. H03K 19/177; H03K 19/096
[52] U.S. Cl. .................................... 307/468; 307/465; 307/469; 307/481; 307/452
[58] Field of Search ............... 307/465, 443, 468, 469, 307/481, 448–449, 451–455, 480; 364/716, 489–491

[56] References Cited

U.S. PATENT DOCUMENTS

| | | | |
|---|---|---|---|
| 3,566,153 | 2/1971 | Spencer, Jr. | 307/468 |
| 3,866,186 | 2/1975 | Suzuki | 307/443 X |
| 3,974,366 | 8/1976 | Hebenstreit | 307/468 |
| 4,183,093 | 1/1980 | Kawagoe | 307/469 X |
| 4,245,324 | 1/1981 | Machol | 307/468 X |
| 4,577,190 | 3/1986 | Law | 307/468 X |
| 4,611,133 | 9/1986 | Peterson et al. | 307/481 X |

OTHER PUBLICATIONS

Mead & Conway, *Introduction to VLSI Systems*, Addison-Wesley Pub. Co., Reading, Mass., Oct. 1980, pp. 80–82.

Cook et al., "Programmable Logic Arrays Using Polysilicon Gate FETS"; *IBM TDB*; vol. 24, No. 4, pp. 1640–1643; 9/1977.

Kraft et al., "Method of Personalizing PLA's Using Multiple/Levels of Polysilicon"; *IBM TDB*; vol. 23, No. 3, pp. 881–882; 8/1980.

Greenspan et al., "Merged AND/OR Array PLA Using Double Polysilicon FET Process"; *IBM TDB*; vol. 23, No. 6, pp. 2189–2191; 11/1980.

Conrad et al., "PLA with Increased Personalization Density"; *IBM TDB*; vol. 19, No. 7, pp. 2628–2629; 12/1976.

*Primary Examiner*—Stanley D. Miller
*Assistant Examiner*—D. R. Hudspeth

[57] ABSTRACT

A programmable logic array 100 which uses parallel transistor logic gates 150 arranged in a compact layout for fast signal propagation. One of logic planes 120 or 130 is prechargeable to substantially reduce power consumption using a simple, one-phase clock.

7 Claims, 5 Drawing Sheets

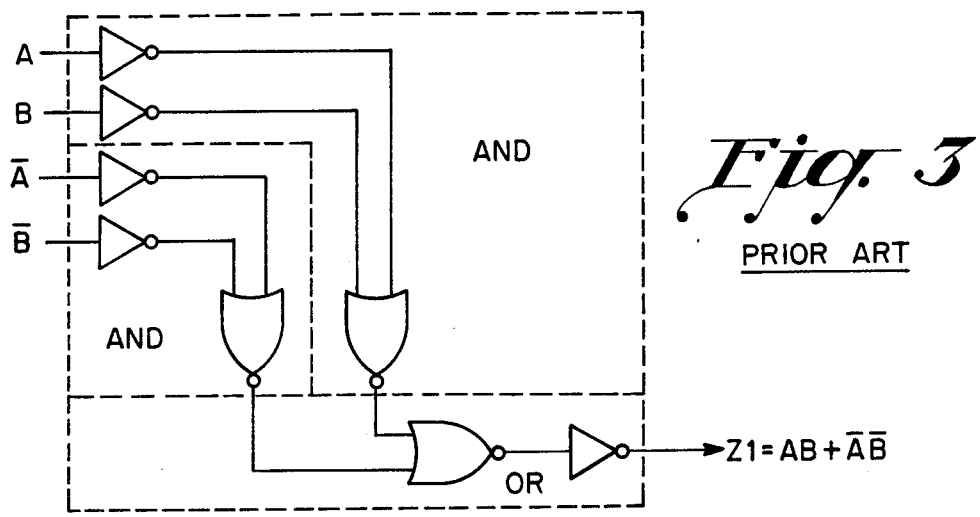
*Fig. 3*
PRIOR ART
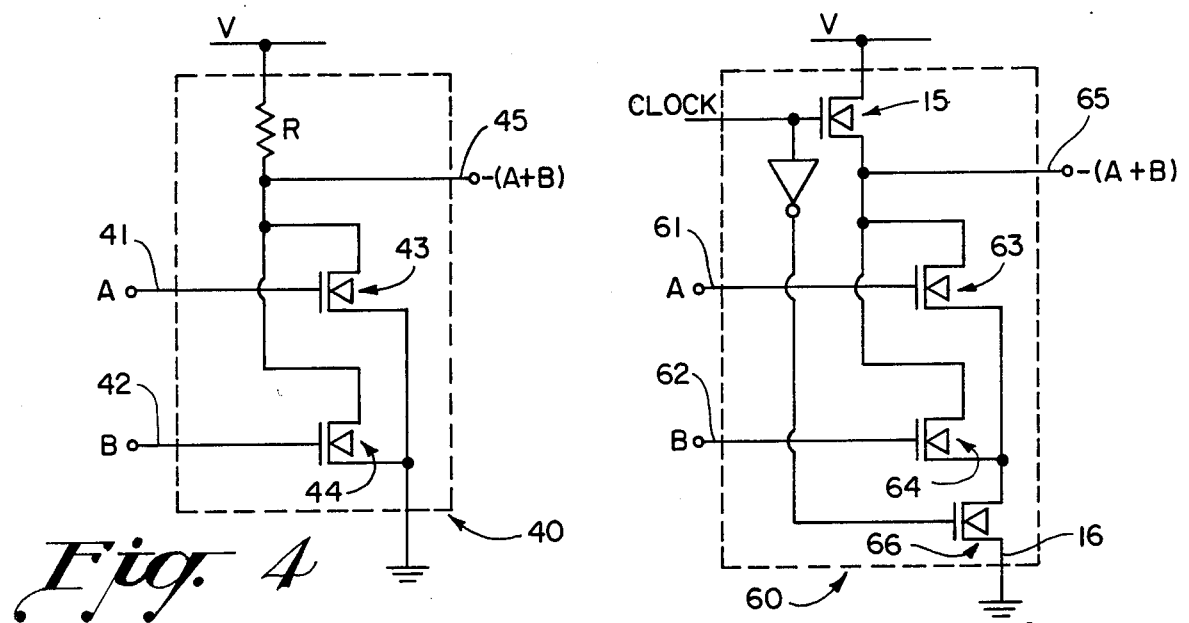
*Fig. 4*
PRIOR ART NOR
*Fig. 6*
PRECHARGED NOR
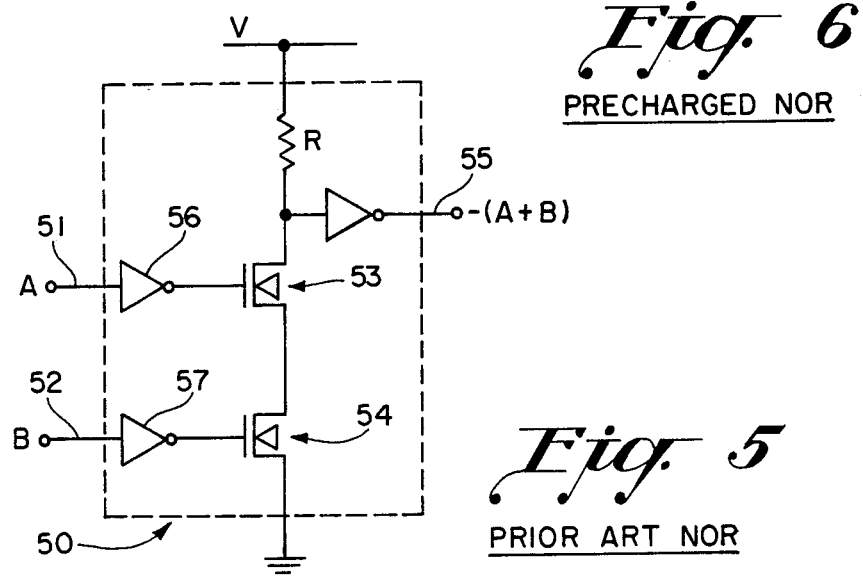
*Fig. 5*
PRIOR ART NOR

CMOS PROGRAMMABLE LOGIC ARRAY USING NOR GATES FOR CLOCKING

BACKGROUND

This invention relates to logic arrays capable of being programmed during fabrication as an integrated circuit device, and more particularly to a programmable logic array (PLA) which uses parallel transistor logic gates arranged in a compact layout for fast signal propagation, and which is prechargable.

A PLA 10, as shown on a small scale in FIG. 1, is a general purpose circuit which is later customized or programmed to perform predefined logical sum-of-product functions. A PLA is programmed by arranging for desired subsets of its input signals I1 through IM to be logically multiplied by a row of AND gates, known as the "AND plane," to produce logical product terms T1 through TP known as "minterms," and further by arranging for desired subsets of the P minterms to be logically added by a column of OR gates, known as the "OR plane," to produce logical sum (of product) PLA output terms Z1 through ZN. The sum-of-product signals Z1 through ZN may be fed pack to other PLA input lines for sequential operations.

AND and OR gates, FIG. 2, can be implemented using the equivalent combination of a NOR gate with an inverter in the NOR gate input lines and output line, respectively, as in FIG. 3. As shown in FIG. 4, a parallel NOR gate 40 is implemented simply by connecting, in parallel, one transistor (43, 44) for each specified NOR gate input line (41,42). Assuming a "true" ("logical one") input signal turns a transistor on, one true input signal causes current conduction through resistor R between the voltage supply V and ground, which causes the voltage at NOR output terminal 45 to drop from V to a "false" ("logical zero") level, regardless of the value of other input signals applied to other input leads of NOR gate 40. If all parallel transistors are off, current is blocked, causing a "true" level voltage at NOR gate output terminal 45.

Alternatively, a series NOR gate can be implemented as in FIG. 5 by connecting one transistor (53, 54) for each specified NOR gate input line (51, 52), in series with a resistor R, between a voltage supply V and a ground potential. If one input signal is true, then that signal, inverted by an inverter (56, 57) to "false" and applied to the control gate of a transistor, prevents conduction through resistor R, and causes a "false" output signal at the series NOR gate output terminal 55 regardless of other NOR input signal values. If the transistors (53, 54) are all ON, the series conducts current through resistor R, causing a "true" output signal on output terminal 55.

The switching speed of a transistor logic gate is that time for an output signal to be provided in response to a set of input signals. Signals flow through any number of parallel transistors simultaneously, in one delay interval, but flow through series transistors one after the other, adding delay intervals. In a series logic gate, the gate capacitance of a first transistor is charged in order to turn on that transistor, in turn charging the gate and diffusion capacitances and turning on each successive transistor, slowing signal propagation. A PLA gate using a large number of series transistors is significantly slower than one using the same transistors connected in parallel. Besides having more capacitance to charge, N transistors in series each need to have N times the cross sectional area of a transistor in a parallel path to transfer the same amount of current with the same voltage drop.

Causing current flow through a bias resistor to establish an output node voltage, whether in a parallel circuit as in FIG. 4 or in a series circuit as in FIG. 5, uses current, wasting power, which is uneconomical and dissipates heat. The transistors must be large so they can transfer enough current to cause a large voltage drop across the resistor.

Power and transistor space can be saved by precharging the capacitance of an output node to a selected voltage and, depending upon the state of the input signals, either maintaining or discharging the precharged voltage to establish the output signal voltage. In this manner current doen not flow in the "conductive stage" as in the non-precharged, resistive circuits of FIGS. 4 and 5.

FIG. 6 shows an example of a prior art precharged, parallel NOR gate 60. An enable transistor 66 is provided in ground line 16 and bias resistor R (of FIG. 4) is replaced with precharge transistor 15. A "precharge mode" is initiated by a high clock signal, which turns off ground line transistor 16 so that there is no path from output node 65 to ground, and also turns on precharge transistor 15. A pulse of precharge current charges the capacitance of output node 65. In a second, "output mode" initiated when the clock signal is low, precharge transistor 15 is turned off, and ground line transistor 16 is turned on. If either signal A or B is true, the corresponding transistor 63 or 64 is turned on, establishing a conductive path from precharged node 65 to ground, discharging node 65 to the low level "false" voltage. If neither A nor B is true, neither transistor 63 nor 64 establishes a path to ground, and node 65 is maintained at the high level "true" voltage.

The output node precharge value corresponds to the condition of no current flow through the bias resistor in a resistive gate as in FIGS. 4 and 5, as shown in Table I.

TABLE I

| Gate Type | Series/ Parallel | Output State Corresponding to Non-conduction |
|---|---|---|
| OR | Series | True |
| OR | Parallel | False |
| NOR | Series | False |
| NOR | Parallel | True |
| AND | Series | False |
| AND | Parallel | True |
| NAND | Series | True |
| NAND | Parallel | False |

In a PLA where AND gate minterm output leads are connected to OR gate product term input leads, precharging AND gate output signals true tends to force OR gate output signals true, which is incompatible with precharging OR gate output leads false. In this event, as the "output mode" is initiated, a conflict exists between the precharged state of the AND and OR arrays, possibly resulting in false triggering of the OR gates. AND gate output leads precharged true can be isolated by transistor switches from incompatible OR gate input leads. However, this requires a multi-phase clock to delay turning on the switches to enable the OR gate input leads until the AND gate output leads have discharged and settled in response to the input signals, to avoid mistriggering OR gates. However, multi-phase clocks are an expense and inconvenience to be avoided.

There remains a need for a PLA circuit which reduces power consumption without using slow series gates or using OR input disabling transistors and a multi-phase clock, which occupy additional circuit area and make the integrated circuit more expensive.

SUMMARY

The present invention achieves these and other objects by providing a PLA which uses high speed parallel transistor NOR gates, with inverters in their input lines to perform as AND gates, or in their output line to perform as OR gates. The PLA structure is laid out compactly to minimize signal path lengths and propagation delays, further increasing operating speed. The compact layout also minimizes the surface area occupied by, and hence the cost of, a PLA embodied in an integrated circuit chip. One of the logic planes, preferably the larger, is precharged to substantially reduce power consumption using a simple onephase clock.

BRIEF DESCRIPTION OF THE DRAWINGS

FIG. 3 is a prior art implementation of the FIG. 2 AND and OR logic functions using equivalent NOT and NOR functions;

FIG. 4 is a schematic diagram of a prior art parallel transistor NOR gate from which an AND gate or an OR gate can be formed by adding input or output inverters, respectively, as in FIG. 3;

FIG. 5 is a schematic diagram of a prior art series transistor NOR gate;

FIG. 6 is a schematic diagram of a prior art precharged parallel transistor NOR gate;

DETAILED DESCRIPTION

A PLA is used in a larger circuit environment operating under a convention, which may be that "true" ("logical one") signals are represented by a relatively high Vdd voltage (5V) and "false" ("logical zero") signals by a relatively low Vss voltage (ground). For this convention, the present invention is preferably implemented with complementary metal oxide semiconductor (CMOS) devices, and charges output nodes to a high voltage Vdd using enhancement mode P-channel "pull-up" transistors. The nodes are discharged to ground Vss using enhancement mode N-channel "pull-down" transistors.

Figure 1:
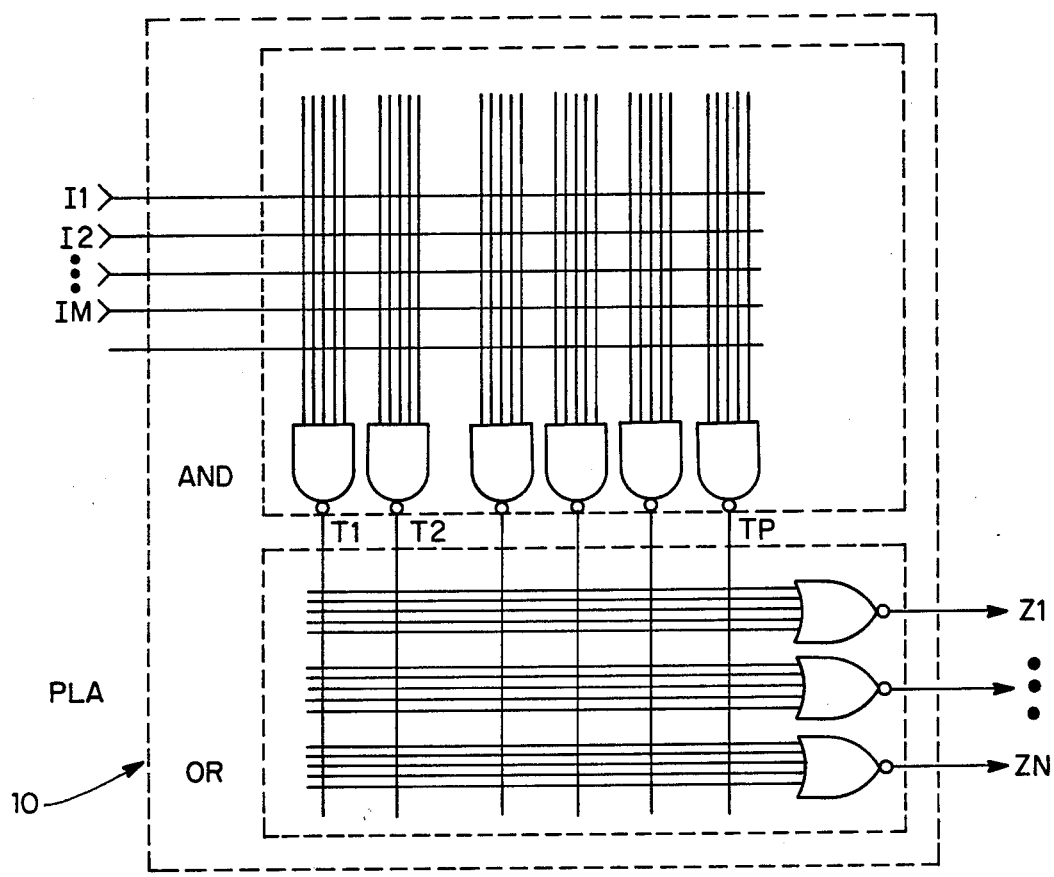
FIG. 1 is a block diagram of a prior art PLA.
Figure 2:
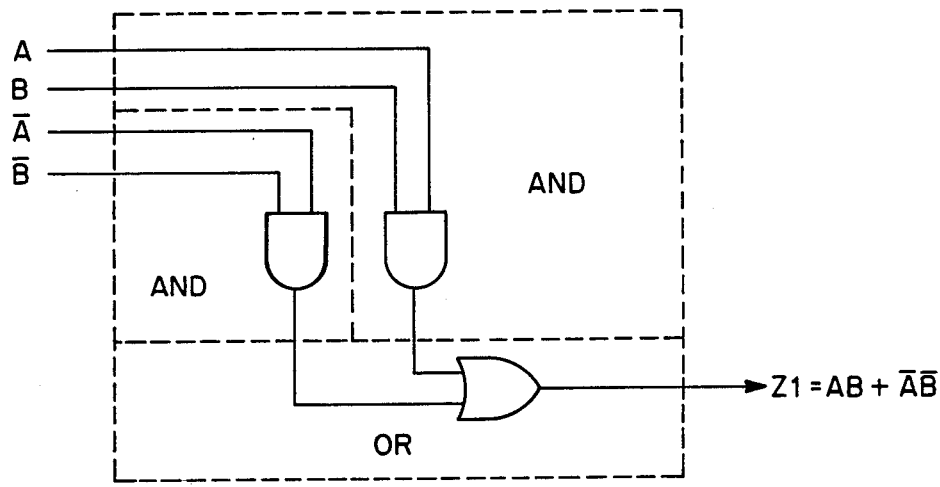
FIG. 2 is a diagram of the sum-of-products logic function performed on four signals input to a PLA in accordance with the prior art.
Figure 7:
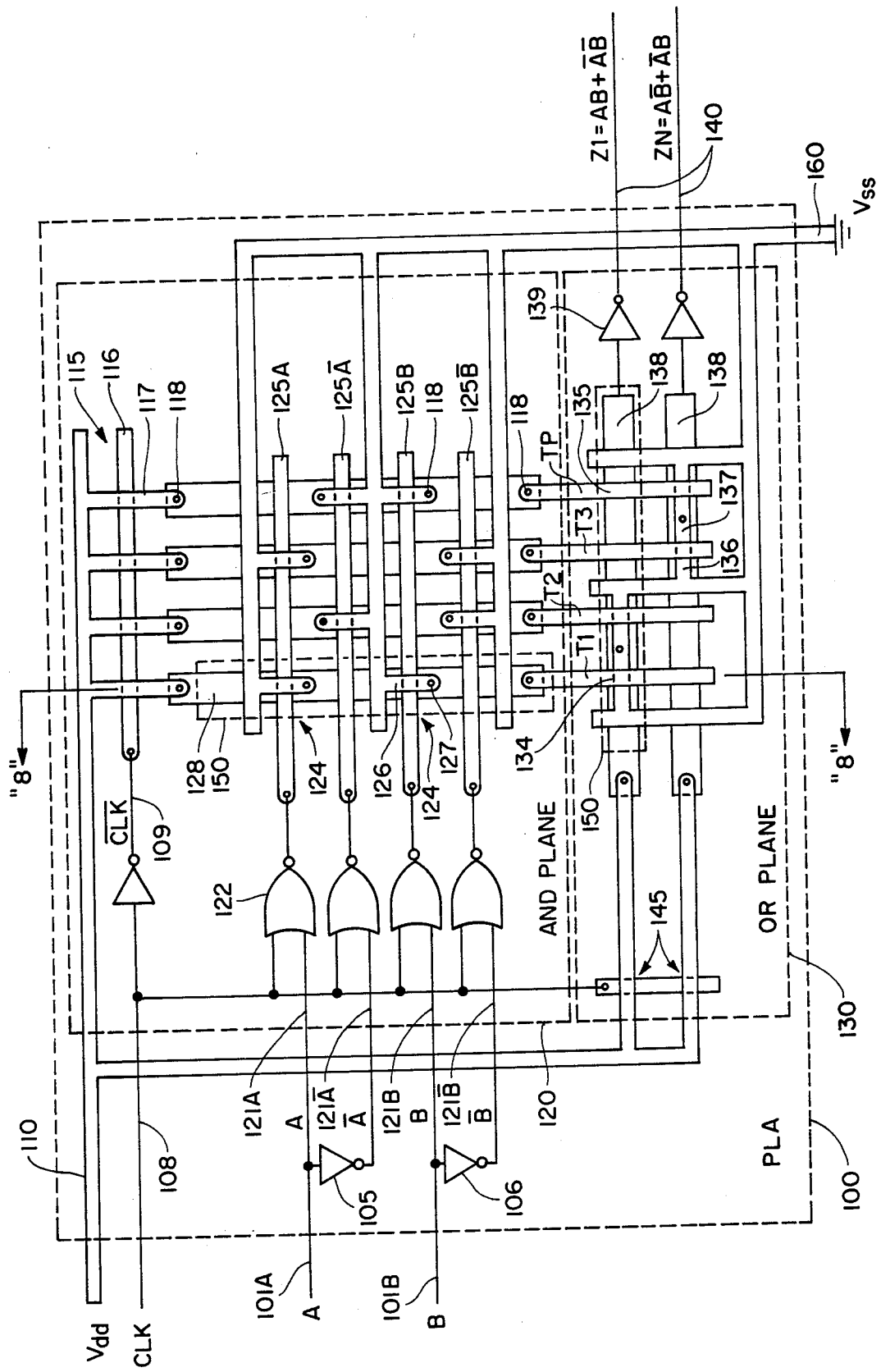
FIG. 7 is a top view of a portion of the layout of a PLA according to one embodiment of the invention.
Figure 8:
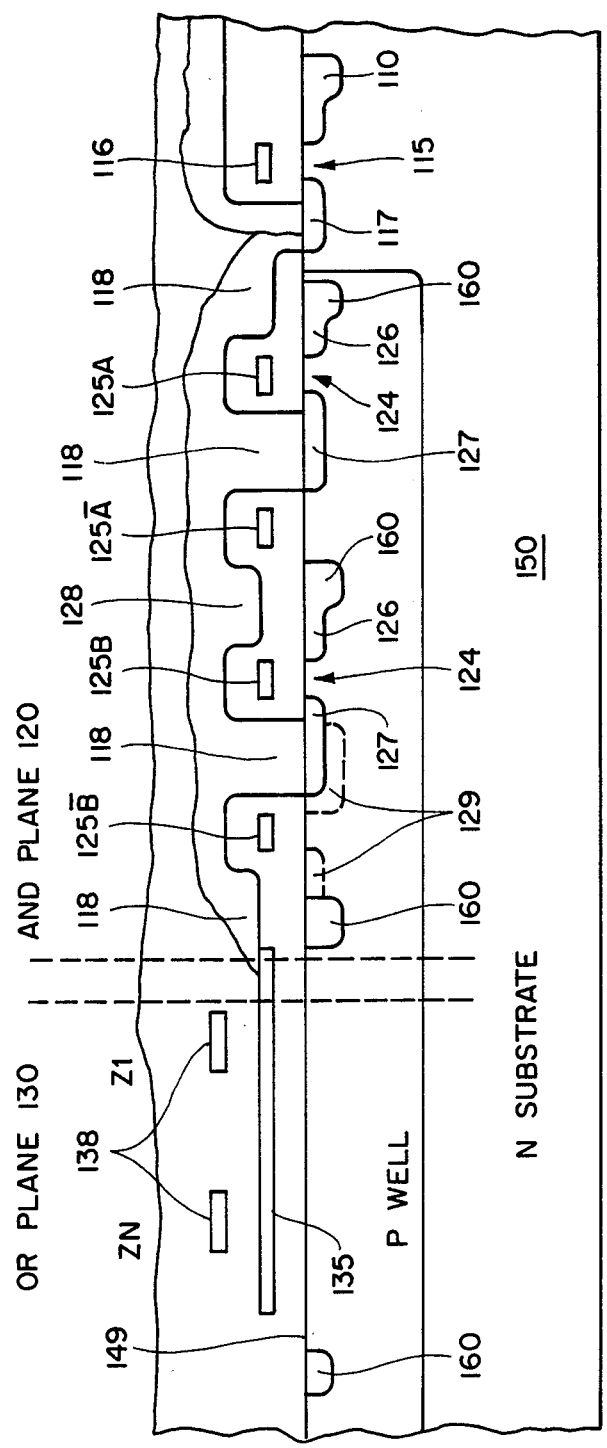
FIG. 8 is a cross-section taken along line 8—8 in FIG. 7 through the left-most NOR gate in the AND plane and its minterm output line extending into the OR plane.

FIG. 7 shows a top view of an example arrangement or "layout" of transistors and conductors making up PLA circuit 100 in a semiconductor chip. FIG. 8 is a cross section through the chip along line 8—8 in FIG. 7, as seen from the right.

PLA 100 receives a plurality of input signals; in the embodiment shown, signals A and B are received on input leads 101-A and 101-B, respectively. Inverters 105 and 106 provide complementary signal pairs A, $\overline{A}$ and B, $\overline{B}$ to AND plane 120. AND plane 120 receives a plurality of signals, (typically, between 4 and 32, in the embodiment of FIG. 7, four input signals) on polycrystalline silicon lines 125A, 125$\overline{A}$, 125B, and 125$\overline{B}$. NOR gates 122 serve to selectively, in response to clock signal CLK. apply the inverses of signals A, $\overline{A}$, B, and $\overline{B}$ to polycrystalline silicon lines 125A, 125$\overline{A}$, 125B, and 125$\overline{B}$, respectively.

Programmed subsets of signals input to AND plane 120 are logically multiplied together to form P, typically between 4 and 48, logical product or "minterm" output signals T1 through TP. The P minterms are applied to input lines 135 of OR plane 130, where N programmed subsets of minterms are logically added to form N sum-of-product output signals Z1 through ZN. N is typically between 1 and 32. In this example, N=2.

PLA 100 constructed in accordance with the teachings of this invention foregoes precharging either AND plane 120 or OR plane 130 and thereby avoids using slower series logic gates or parallel logic gates with a multi-phase clock and extra input-disabling transistors. A single one-phase clock signal CLK applied via lead 108, FIGS. 7 and 9, disables and precharges preferably the plane with more output nodes, to minimize the number of gates using current through their bias resistors. In the preferred embodiment, the larger AND plane 120 is precharged.

AND plane 120 and OR plane 130 are implemented using parallel transistor NOR gates (124,134) with NOR gates 122 serving as inverters in the M input lines to the AND plane and with inverters 139 in the N output lines from the OR plane. NOR gate 150 has substantially the same cross section in AND plane 120, as shown in FIG. 8, and in OR plane 130, except generally different numbers (M and P) of transistor gate lines (125, 135), and programmed numbers of source-drain diffusions (126–127, 136–137) forming transistors (124, 134) with the gate lines.

In AND plane 120, for example, polycrystalline silicon lines 125 serve as control gate electrodes for a plurality of transistors 124 formed according to the predetermined sum-of-products function, using well known masking and ion implantation techniques, to form diffused regions 126 and 127. For each transistor 124, diffused region 126 on one side of the polycrystalline silicon line 125A through 125$\overline{B}$ serves as the source, and is connected to ground Vss through diffused line 160. The diffused region 127 on the other side of the polycrystalline silicon line 125A through 125$\overline{B}$ serves as the drain and is connected through electrical contacts 118 to a conductive lead 128 (typically aluminum) connected between precharge transistors 115 and a selected minterm output lead T1 through TP. In this manner, when a transistor 124 turns on in response to the signal applied to its polycrystalline silicon gate 125, its minterm metal line 128 is pulled to ground (Vss), thereby providing the desired minterm output signal. Line 128 is pulled to Vss when the minterm is false.

In FIG. 8, where NOR gate output metal line 128 crosses unselected input gate line 125$\overline{B}$, source and drain regions are omitted, as indicated by dashed outline 129. Output nodes 128 are connected by electrical contacts 118 to all regions programmed for drain diffusions 127, or simply to all potential drain diffusion regions.

In an alternate embodiment, diffused region 160 is formed in a manner to make source and drain diffusions at all possible locations within AND plane 120, but electrical contacts 118 are only formed to allow selected transistors to pull down metal lines 128, in accordance with the desired sum-of-products function.

In the preferred embodiment of PLA 100 using 3 micron minimum width lines, a transistor 124 or 134 occupies only about ⅓ of a square mil.

Figure 9:
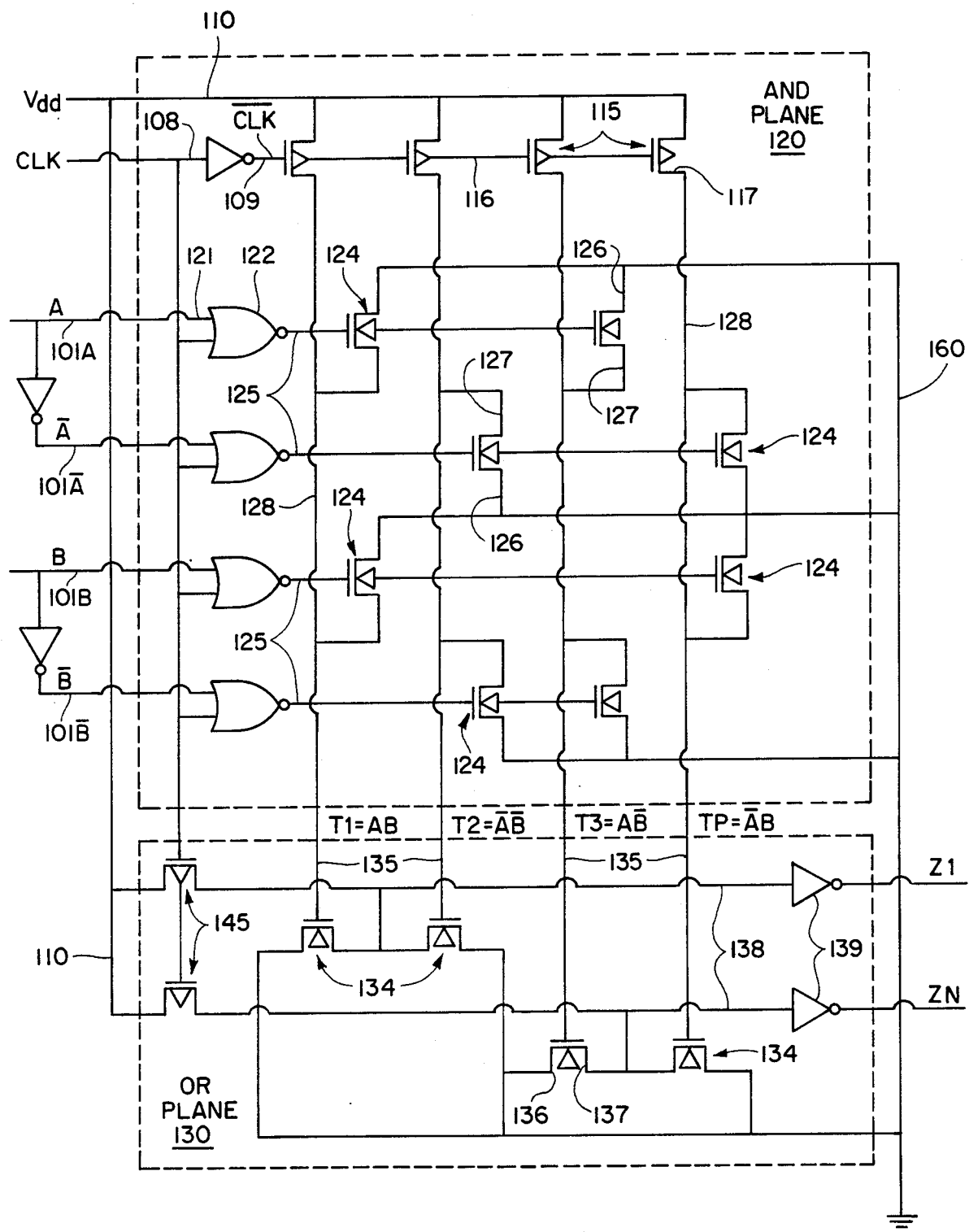
FIG. 9 is a schematic diagram of the AND and OR planes as programmed in the layout of FIG. 7.

The circuit formed by the example programming of the FIG. 7 PLA layout is shown in FIG. 9. Input NOR gates 122 serve as AND plane input signal inverters. Each gate 122 has a second input terminal connected to clock signal CLK lead 108. The high or "true" voltage level "precharge" portion of clock signal CLK applied to input NOR gates 122 forces all of the AND plane input signals on lines 125 to low or "false", which turns off all of AND plane N channel NOR transistors 124, disconnecting and leaving minterm output nodes 128 floating. Simultaneously, a low voltage inverted clock signal $\overline{CLK}$ from lead 109 applied to polycrystalline silicon gate line 116 turns on AND plane pull-up P channel transistors 115, connecting the voltage supply diffusion Vdd 110 to floating AND minterm output nodes 128, precharging their capacitance to "true" voltage Vdd.

In the precharge mode, the high clock signal CLK on lead 108 turns off OR plane P channel pull up transistors 145. The AND plane output minterm lines 128 precharged to Vdd keep all of the OR plane N channel pull-down transistors 134 turned on, grounding OR sum term leads 138 to Vss diffusion 160.

The second half-cycle of clock signal CLK puts PLA 100 in the "output mode." A high CLK signal applied to line 116 turns off P channel pull-up transistors 115. Simultaneously, the low CLK signal applied to the second terminal of each input NOR gate 122 enables AND plane input lines 121. AND plane input signals A,$\overline{A}$,B,$\overline{B}$ are inverted by enabled NOR gates 122 and applied to the gates of NOR output transistors 124. A false signal on one (or more) AND plane input lines 101A through 101$\overline{B}$ causes a high voltage to appear on the corresponding gate line 125. This suffices to conduct current to ground from each output node minterm line 128 across which line 125 forms a pull-down transistor 124.

During the output mode, the low CLK signal on lead 108 turns on OR plane pull-up transistors 145. If all of the transistors 134 connected to a given OR plane metal sum-of-product term lead 138 are turned off by low minterm signals the associated OR plane pull-up transistor 145 raises the voltage of the connecting sum-of-product term output line 138, and this signal is in turn inverted by OR plane output inverters 139. Thus, if no minterm from AND plane 120 grounds an OR plane metal line 138, line 138 voltage is pulled high by associated pull-up transistor 145, and the high value is inverted by inverter 139 to provide a low or false output signal.

Conversely, if there are no false input signals to a given AND gate of AND plane 120, its minterm output line 128 is not grounded, and holds its "true" precharge signal. A true (high) signal on OR plane input line 135 keeps the corresponding NOR gate transistor 134 conducting, grounding OR plane metal line 138. Although OR plane pull-up transistors 145 stay on (in effect, acting as resistors) during the output mode, they are overridden by the larger OR plane pulldown transistors 134 which keep the line 138 voltage low. The low signal on line 138 is inverted into a high or "true" output signal Z.

The preferred embodiment of PLA 100 is capable of performing sum-of-product operations at a rate of 4 megahertz with 3 micron CMOS technology. A smaller geometry technology could run even faster.

A preferred embodiment has been illustrated, of which modifications and adaptations within the scope of the invention will occur to those skilled in the art. For example, the OR plane can be precharged instead of the AND plane. This is done by replacing each AND plane input NOR gate 122 with a NAND gate, and by inverting the clock signal so that during the precharge mode a low signal $\overline{CLK}$ is applied to the input NAND gates and to OR plane pull-up transistors 145 while a high signal CLK is applied to line 109 to AND plane pull-up transistors 115. In this manner, polysilicon gate lines 125 forced high in the precharge mode cause AND plane output lines 128 to be grounded, and low signals on OR plane input lines 135 turn off transistors 134, allowing OR output nodes 138 to be precharged to the "true" high voltage Vdd. The $\overline{CLK}$ signal is applied to the plane being precharged, and the clock signal to the grounded plane.

In alternate embodiments, interchanging all of the transistor types, logic convention, and voltage supply polarities obtains the same net result. A PLA circuit could also be constructed using depletion mode (normally on) CMOS transistors, or heavily doped and lightly doped (intrinsic) transistors of one conductivity type, although single conductivity type devices do not turn on to precharge, or turn off to stop discharge, as fully as CMOS devices. The invention is limited only by the scope of the following claims.

I claim:

1. A prechargeable NOR logic gate circuit comprising:
   a source of electrical power including a point of reference potential;
   a plurality of NOR gates having input lines;
   a NOR gate output line;
   means for providing a single phase clock signal coupled to said input lines of the NOR gates, said clock signal comprising two complementary half cycles;
   precharge transistor means having a first current lead connected to said power source, a second current lead connected to said output line, and a control lead responsive to said clock signal means during a first one-half cycle of said clock signal to cause conduction between said current leads of said precharge transistor means for precharging said output line to the potential of said power source;
   a plurality of discharge transistors coupled to said plurality of NOR gates, said discharge transistors being connected in parallel, each discharge transistor having a first current lead coupled to said output line, a second current lead coupled to said reference potential, and a control lead responsive to a TRUE value NOR input signal for causing conduction between said discharge transistor current leads to discharge said output line to the potential of said point of reference potential during the second half cycle of said clock signal; and
   means coupled to said NOR gates for enabling said discharge transistor control leads to be driven by signals from said input lines in response to said single phase clock signal.

2. A circuit as in claim 1, wherein said prechargeable NOR logic gate circuit comprises a first logic gate circuit which is repeated a first plurality of times to form a first logic plane, in combination with a second logic gate circuit repeated a plurality of times to form a second logic plane in which each second logic gate circuit includes:
- an output lead;
- a resistive charge transistor having a first current lead connected to said power source, a second current lead connected to the second gate output line, and a control lead responsive to said clock signal in said second half cycle to cause conduction between said resistive charge transistor current leads to provide charging current for charging said second logic gate output line towards the potential of said power source; and
- a plurality of discharge transistors connected in parallel each having a first current lead connected to the second gate output line, a second current lead connected to said point of reference potential, and each having a control lead responsive to receiving a TRUE value NOR input signal to cause conduction between said second logic gate discharge transistor current leads to provide discharge current to override said charging current and thereby discharge said second gate output line to said point of reference potential;
- the output lines from one of said planes serving as input lines to the other of said planes, whereby signals applied to said one plane at the beginning of a clock signal period are combined by said planes in a selected function to produce an output signal from the other of said planes by the end of said clock signal period.

3. A circuit as in claim 2 comprising CMOS transistors having channels of one conductivity type for the precharge transistors in said first plane and for the resisitive charge transistors in said second plane, and having channels of the opposite conductivity type for the discharge transistors in both planes.

4. A circuit as in claim 3 wherein, in both said planes, said gate discharge transistor current leads are provided by source/drain diffusion regions formed beneath, and controlled by, selected control leads.

5. A circuit as in claim 2 wherein said first plane is an AND plane in which said means to enable said discharge transistor control leads applies the inverses of signals received on said gate input lines, in response to said clock signal being in said alternate phase, and wherein said second plane is an OR plane in which each said gate output line is applied to an inverter to provide a PLA output signal.

6. A programmable logic array (PLA) structure including:
- a source of electrical power including a point of reference potential;
- a first plurality of PLA input signal lines;
- a second plurality of PLA output signal lines;
- an AND plane including a third plurality of AND logic gates each comprising
- an AND logic gate outputline for providing a minterm output signal;
- discharge transistors, connected in parallel, each having a first current lead connected to said power source, a second current lead connected to the AND gate output line, and a control lead responsive to a FALSE value signal received on a PLA input signal line to cause conduction between said current leads to discharge said AND gate output line to the potential of said power source;
- an OR plane including a second plurality of OR logic gates each comprising
- an OR logic gate output line driving a respective PLA output line;
- discharge transistor, connected in parallel, each having a first current lead connected to the OR gate output line, a second current lead connected to said point of reference potential and a control lead responsive to receiving a TRUE value minterm signal to cause conduction between said OR gate discharge transistor current leads to discharge said OR gate output line to the potential of said point of reference potential; and
- means for providing a single-phase clock signal having uninverted and inverted half cycles characterized by alternate phases, said PLA structure being characterized in that:
- in a first of said planes, each logic gate further comprises a precharge trasnistor having a first current lead coupled to the gate output line, a second current lead coupled to said point of reference potential, and a control lead responsive to said clock signal in one precharge phase to cause conduction between said precharge transistor current leads to precharge said gate output line to the reference potential and wherein said discharge transistors only conduct to discharge said first plane logic gate output lines during an alternate discharge phase of said clock signal; and in that
- in the second of said planes, each logic gate further comprises a resistive charge transistor having a first current lead connected to the gate output line, a second current lead connected to the point of reference potential, and a control lead responsive to said clock signal to cause conduction between said resistive charge transistor current leads so that charging current is provided for charging said second plane logic gate output line towards the reference potential subject to being overridden by discharging current conducted through discharging transistors in said logic gate,
- whereby signals applied to PLA input lines at the beginning of one half cycle in a given period of the single phase clock signal are combined by the PLA, according to a programmed function, to produce sum-of-products signals at the PLA output lines by the end of the succeeding half cycle in said given period of said clock signal.

7. A PLA structure as in claim 6 wherein the first of said planes is the AND plane and the second of said planes is the OR plane.

* * * * *